United States Patent
Lee et al.

(10) Patent No.: US 8,507,366 B2
(45) Date of Patent: Aug. 13, 2013

(54) RAPID THERMAL PROCESSING SYSTEM AND SULFIDATION METHOD THEREOF

(75) Inventors: Shih-Wei Lee, Kaohsiung (TW);
Ming-Hung Lin, Pingtung County (TW); Yao-Tsang Tsai, Tainan (TW)

(73) Assignee: Axuntek Solar Energy, Pingtung, Pingtung County (TW)

( * ) Notice: Subject to any disclaimer, the term of this patent is extended or adjusted under 35 U.S.C. 154(b) by 0 days.

(21) Appl. No.: 13/471,410

(22) Filed: May 14, 2012

(65) Prior Publication Data
US 2013/0130432 A1    May 23, 2013

(30) Foreign Application Priority Data
Nov. 21, 2011   (TW) .............................. 100142510 A

(51) Int. Cl.
*H01L 21/36* (2006.01)
*H01L 21/20* (2006.01)
*H01L 21/477* (2006.01)

(52) U.S. Cl.
USPC ............................ 438/479; 437/478; 437/799

(58) Field of Classification Search
USPC ......................................... 438/478, 479, 799
See application file for complete search history.

(56) References Cited

U.S. PATENT DOCUMENTS

| | | | | |
|---|---|---|---|---|
| 8,323,408 B2* | 12/2012 | Zolla et al. | ..................... | 118/718 |
| 8,372,683 B2* | 2/2013 | Huang | ............................. | 438/72 |
| 2008/0305247 A1 | 12/2008 | Von Klopmann | | |
| 2011/0139246 A1* | 6/2011 | Drayton | ........................ | 136/260 |
| 2011/0207297 A1 | 8/2011 | Yaginuma | | |
| 2011/0295539 A1* | 12/2011 | Tsai et al. | ....................... | 702/99 |

* cited by examiner

*Primary Examiner* — Luan C Thai
(74) *Attorney, Agent, or Firm* — Winston Hsu; Scott Margo

(57) ABSTRACT

A rapid thermal processing system includes a rapid thermal processing furnace, a back electrode substrate, and a cover. The rapid thermal processing furnace includes a reaction chamber and a heating device. The heating device is capable of generating heat energy. The back electrode substrate is adapted to dispose in the reaction chamber and has a precursor layer and a selenium layer formed on the precursor layer. The cover is disposed at a position corresponding to the selenium layer on the back electrode substrate and has a sulfur in solid form formed thereon, so as to make the sulfur in solid form opposite to the selenium layer. After the sulfur in solid form absorbs the heat energy generated by the heating device, the sulfur in solid form reacts with the selenium layer and the precursor layer to form a photoelectric transducing layer.

15 Claims, 5 Drawing Sheets

RAPID THERMAL PROCESSING SYSTEM AND SULFIDATION METHOD THEREOF

BACKGROUND OF THE INVENTION

1. Field of the Invention

The present invention relates to a rapid thermal processing system and sulfidation method thereof, and more specifically, to a rapid thermal processing system utilizing a rapid thermal process to heat a sulfur in solid form and a selenium layer which are formed on a cover and a back electrode substrate respectively and opposite to each other and a sulfidation method thereof.

2. Description of the Prior Art

In general, there are three types of sulfidation methods of utilizing a rapid thermal process to form a CIGSS (copper indium gallium selenide sulfide) layer: utilizing $H_2S$ gas to react with a CIGS (copper indium gallium selenide) layer, directly heating a sulfur in solid form and a selenium layer with a CIG (copper indium gallium) stacked layer, and supplying sulfur steam to react with a CIGS layer.

The first sulfidation method involves utilizing a rapid thermal process to heat a back electrode substrate having a CIGS layer formed thereon to a specific temperature (e.g. greater than 500° C.) and then supply $H_2S$. Accordingly, a substitution reaction may occur between $H_2S$ and the CIGS layer so as to form a CIGSS layer. The drawback of this method is that $H_2S$ is a harmful gas and time needed for the substitution reaction occurring between $H_2S$ and the CIGS layer is too long.

In the second sulfidation method, excessive diffusion of sulfur may occur since a sulfur in solid form could directly react with a CIG stacked layer to form a CIGSS layer. Thus, this method may cause a significant decrease of current and make the subsequent sulfidation reaction hard to control because the reaction rate of the sulfur in solid form and the CIG stacked layer is too fast.

In the third sulfidation method, sulfur steam may be attached to a precursor layer on a back electrode substrate so as to cause an uneven sulfidation problem if the sulfur steam is supplied in the initial stage of a rapid thermal process. If the sulfur steam is supplied during the rapid thermal process instead, the sulfur steam may react with the CIGS layer in different temperatures so as to influence the forming quality of the CIGSS layer. On the other hand, if the sulfur steam is supplied after the back electrode substrate is heated to a specific temperature (e.g. greater than 500° C.), it may further cause the problem that time needed for the substitution reaction occurring between the sulfur steam and the CIGS layer is too long.

In summary, each of the aforesaid sulfidation methods has its own drawback. Thus, how to reduce the process time of the sulfidation process and improve the sulfidation quality of the sulfidation process is an important issue of the solar industry.

SUMMARY OF THE INVENTION

The present invention provides a rapid thermal processing system. The rapid thermal processing system includes a rapid thermal processing furnace, a back electrode substrate, and a cover. The rapid thermal processing furnace includes a reaction chamber and a heating device. The heating device is used for generating heat energy. The back electrode substrate is adapted to dispose in the reaction chamber and has a precursor layer and a selenium layer formed on the precursor layer. The cover is disposed at a position corresponding to the selenium layer on the back electrode substrate and has a sulfur in solid form formed thereon, so as to make the sulfur in solid form opposite to the selenium layer. After the sulfur in solid form absorbs the heat energy generated by the heating device, the sulfur in solid form reacts with the selenium layer and the precursor layer to form a photoelectric transducing layer.

The present invention further provides a sulfidation method for forming a photoelectric transducing layer on a back electrode substrate. A precursor layer is formed on the back electrode substrate. The sulfidation method includes forming a selenium layer and a sulfur in solid form on the precursor layer and a cover respectively, disposing the back electrode substrate and the cover in a rapid thermal processing furnace in a manner of the selenium layer being opposite to the sulfur in solid form, and heating the sulfur in solid form to react with the selenium layer and the precursor layer for forming the photoelectric transducing layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
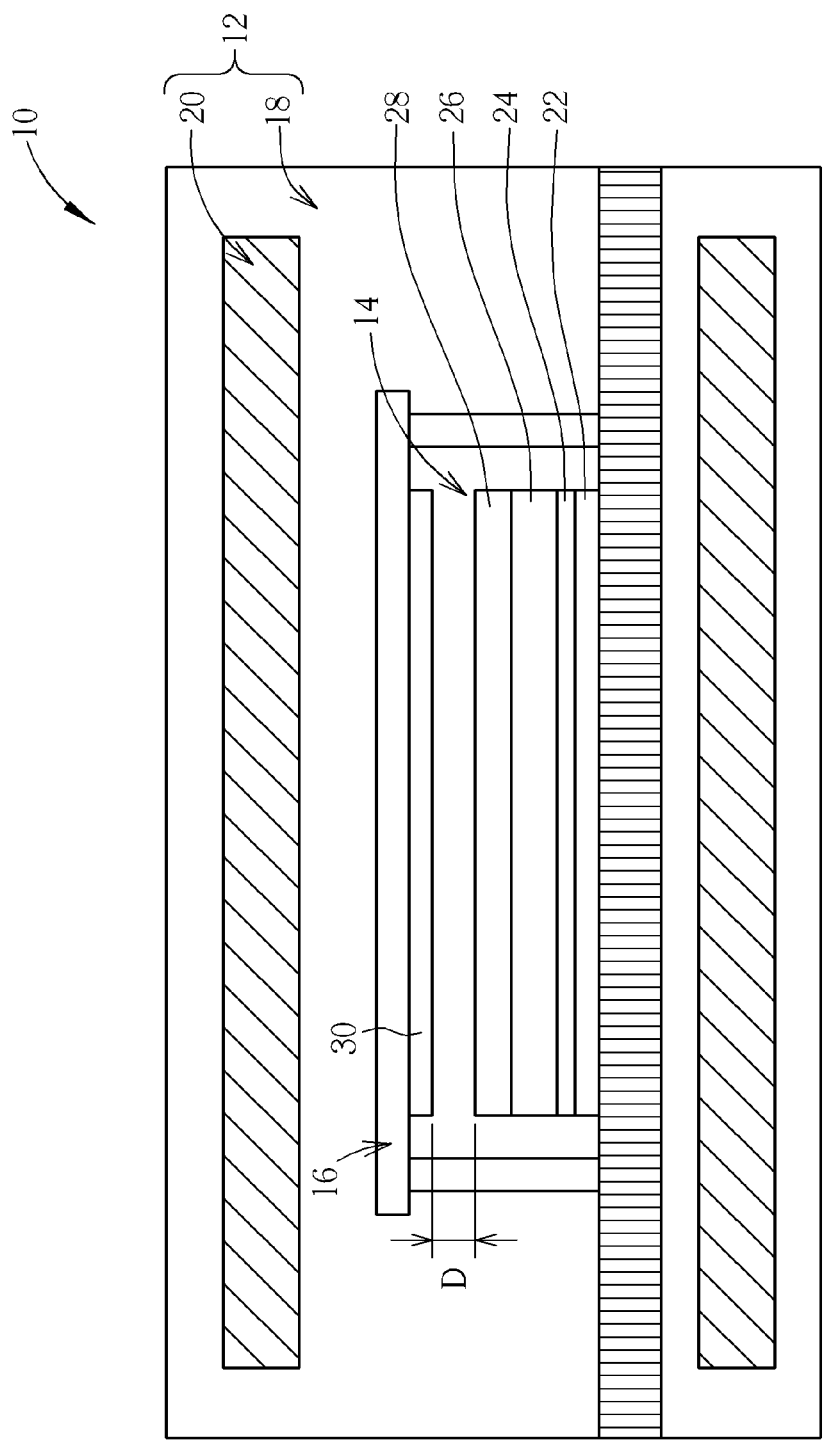
FIG. 1 is an inner diagram of a rapid thermal processing system according to an embodiment of the present invention.

Please refer to FIG. 1, which is an inner diagram of a rapid thermal processing system 10 according to an embodiment of the present invention. The rapid thermal processing system 10 is applied to a sulfidation process of a solar battery. As shown in FIG. 1, the rapid thermal processing system 10 includes a rapid thermal processing furnace 12, a back electrode substrate 14, and a cover 16.

The rapid thermal processing furnace 12 could be a conventional rapid thermal processing equipment for a sulfidation process of a solar battery. As shown in FIG. 1, the rapid thermal processing furnace 12 includes a reaction chamber 18 and at least one heating device 20 (two shown in FIG. 1). The heating device 20 is disposed in the reaction chamber 18 for heating the reaction chamber 18 or directly heating the back electrode substrate 14 to a temperature in which a photoelectric transducing layer could be formed on the back electrode substrate 14 by a sulfidation reaction. The heating device 20 could be a heating equipment commonly applied to a rapid thermal process, such as a heating lamp, a quartz lamp, or a high-temperature chamber. As for the related component designs of rapid thermal processing furnace 12, they are commonly seen in the prior art and the related description is therefore omitted herein.

In general, the back electrode substrate 14 includes a substrate 22 and a back electrode 24. The substrate 22 could be a soda-lime glass, and the back electrode 24 could be made of molybdenum (Mo) material, Tantalum (Ta) material, Titanium (Ti) material, Vanadium (V) material, or Zirconium (Zr) material. In this embodiment, a precursor layer 26 and a selenium layer 28 are further formed on the back electrode substrate 14. The selenium layer 28 is formed on the precursor layer 26. The precursor layer 26 is made of copper (Cu) material, indium (In) material, and gallium (Ga) material, such as a Cu—Ga alloy and In stacked layer, a Cu—Ga—In alloy, or a Cu—Ga—In stacked layer.

Figure 2:
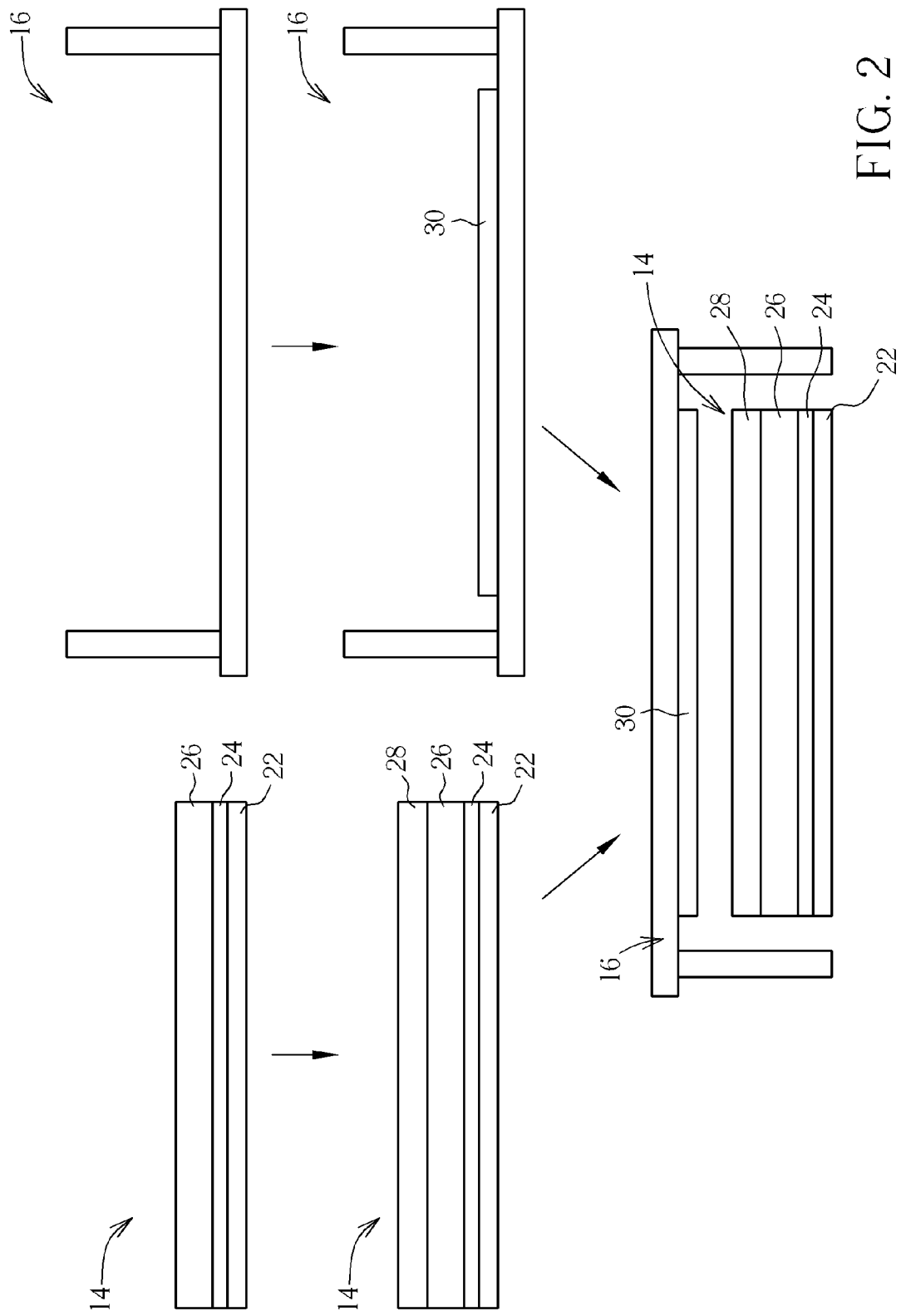
FIG. 2 is diagram of a cover with a sulfur in solid form deposited thereon being disposed above a back electrode substrate with a selenium layer deposited thereon.

Next, please refer to FIG. 1 and FIG. 2. FIG. 2 is diagram of the cover 16 with a sulfur 30 in solid form deposited thereon being disposed above the back electrode substrate 14 with the selenium layer 28 deposited thereon. As shown in FIG. 1 and FIG. 2, the cover 16 is preferably an open frame to be disposed above the back electrode substrate 14 and has the sulfur 30 in solid form formed thereon corresponding to the selenium layer 28 for making the sulfur 30 in solid form opposite to the selenium layer 28 up-and-down. To be noted, all designs of disposing a cover at a position corresponding to a selenium layer of a back electrode substrate so as to make a sulfur in solid form opposite to the selenium layer (e.g. the sulfur in solid form being opposite to the selenium layer left-and-right) may fall within the scope of the present invention. Furthermore, in this embodiment, the cover 16 is preferably made of heat absorbing material (e.g. carbon) for quickly absorbing heat energy generated by the heating device 20, but not limited thereto, meaning that the cover 16 could also be made of other material (e.g. glass ceramics or quartz) commonly applied to a sulfidation process. As for which material is utilized, it depends on the process needs of the rapid thermal processing system 10. Accordingly, the sulfur 30 in solid form could react with the selenium layer 28 and the precursor layer 26 to form a photoelectric transducing layer.

Figure 3:
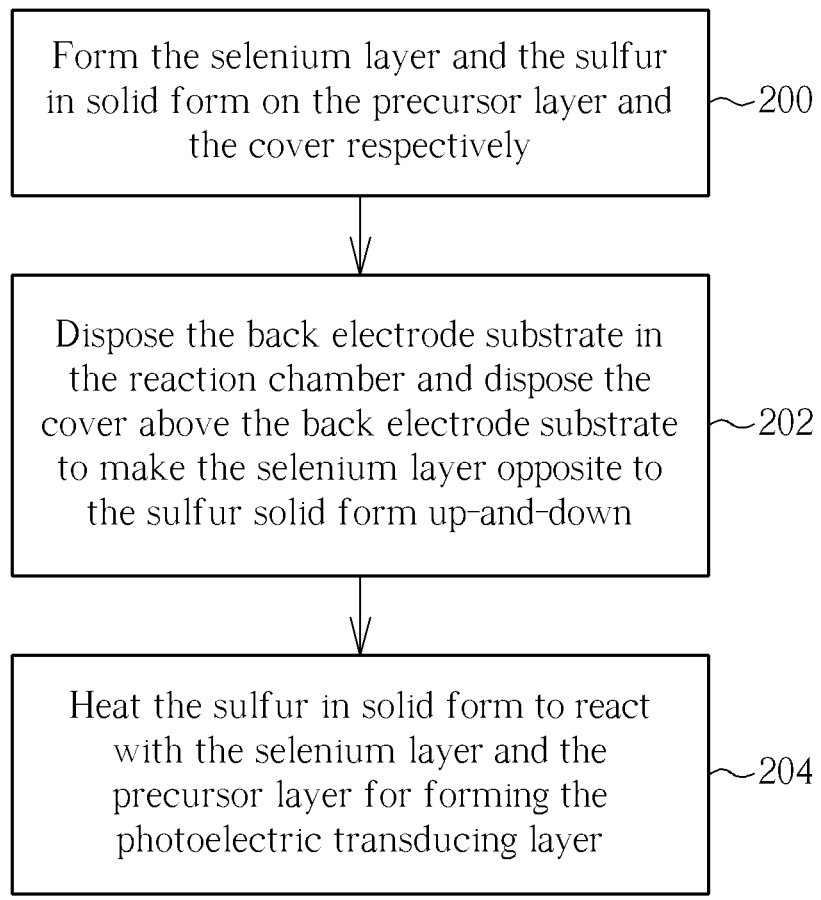
FIG. 3 is a flowchart of a sulfidation method of utilizing the rapid thermal processing system in FIG. 1 to form a photoelectric transducing layer of the back electrode substrate.

Next, please refer to FIG. 1, FIG. 2, and FIG. 3. FIG. 3 is a flowchart of a sulfidation method of utilizing the rapid thermal processing system 10 in FIG. 1 to form a photoelectric transducing layer of the back electrode substrate 14. The sulfidation method includes the following steps.

Step 200: Form the selenium layer 28 and the sulfur 30 in solid form on the precursor layer 26 and the cover 16 respectively;

Step 202: Dispose the back electrode substrate 14 in the reaction chamber 18 and dispose the cover 16 above the back electrode substrate 14 to make selenium layer 28 opposite to the sulfur 30 in solid form up-and-down;

Step 204: Heat the sulfur 30 in solid form to react with the selenium layer 28 and the precursor layer 26 for forming the photoelectric transducing layer.

More detailed description for the aforesaid steps is provided as follows. After the back electrode 24 and precursor layer 26 of the back electrode substrate 14 are formed sequentially, the selenium layer 28 and the sulfur 30 in solid form could be formed on the precursor layer 26 and the cover 16 respectively (Step 200). As for description of the processes of forming the back electrode 24 and the precursor layer 26 on the substrate 22, it is commonly seen in the prior art. In brief, a sputtering machine or other electrode forming technology is utilized to form the back electrode 24 on the substrate 22, and a thin-film deposition technology (e.g. a sputtering process) is then utilized to form the precursor layer 26 on the back electrode 24. Finally, the selenium layer 28 could be formed on the precursor layer 26 by an evaporation process to form a stacked layer. In addition, the sulfur 30 in solid form could be formed as a sulfur thin film on the cover 16 by a coating process or a spray process.

Subsequently, the back electrode substrate 14 with the selenium layer 28 and the precursor layer 26 deposited thereon could be disposed in the reaction chamber 18, and then the cover with the sulfur 30 in solid form deposited thereon could be disposed above the back electrode substrate 14 (Step 202), so as to make the selenium layer 28 opposite to the sulfur 30 in solid form (as shown in FIG. 1). That is, the sulfur 30 in solid form is away from the selenium layer 28 by an interval D. Furthermore, for improving the forming quality of the photoelectric transducing layer, the selenium layer 28 could be opposite to the sulfur 30 in solid form in a face-to-face manner. In addition, the sequence mentioned the step of disposing the back electrode substrate 14 and the cover 16 in the reaction chamber 18 of the rapid thermal processing furnace 12 is not limited to the sequence mentioned in Step 202. That is, in another embodiment, before the back electrode substrate 14 and the cover 16 are disposed in the reaction chamber 18 of the rapid thermal processing furnace 12, the cover 16 with the sulfur 30 in solid form could be disposed above the back electrode substrate 14 in advance.

Finally, the heating device 20 could be activated to provide heat energy (the heating rate is about 2° C./sec to 5° C./sec) to the reaction chamber 18 for heating the sulfur 30 in solid form on the cover 16 to react with the selenium layer 28 and the precursor layer 26 on the back electrode substrate 14, so that the photoelectric transducing layer could be formed accordingly.

During the heating device 20 heats the reaction chamber 18, the selenium layer 28 could react with the precursor layer 26 to form a CIGS layer. At the same time, the sulfur 30 in solid form could be heated to form sulfur steam, and then the sulfur steam could be diffused to the selenium layer 28 and the precursor layer 26 to form a CIGSS thin film on the surface of the CIGS layer so that the photoelectric transducing layer could be formed accordingly.

Compared with the prior art utilizing the substitution reaction occurring between the sulfur steam and the CIGS layer in a high temperature (about 515° C.) to form the CIGSS thin film after the CIGS layer is formed, the CIGSS thin film and the CIGS layer in the present invention could be formed simultaneously in a lower temperature (about 485° C.). In such a manner, not only could the sulfidation method provided by the present invention efficiently reduce the reaction time of the sulfur 30 in solid form, the selenium layer 28 and the precursor layer 26 to solve the prior art problem that the substitution reaction occurring between the sulfur steam and the CIGS layer is too long, but also decrease the temperature needed for forming the photoelectric transducing layer. In addition, the sulfidation method provided by the present invention could also be performed without utilizing harmful gas (e.g. $H_2S$).

Furthermore, as the rate of the gallium element in the precursor layer 26 reacting with the sulfur element is greater than the rate of the gallium element in the precursor layer 26 reacting with the selenium element, the design in which the selenium layer 28 is opposite to the sulfur 30 in solid form could further delay the combination of the sulfur element and the gallium element. Thus, compared with the sulfidation method of directly heating the sulfur in solid form and the selenium layer with the CIG stacked layer, the present invention could prevent a significant decrease of current caused by excessive diffusion of the sulfur in solid form and solve the problem that the sulfidation reaction is hard to control because the reaction rate of the sulfur in solid form and the CIG stacked layer is too fast. In addition, via the design in which forming of the selenium layer and the sulfur in solid form could be performed at the same time instead of the prior art method in which the sulfur in solid form and the selenium layer need to be formed sequentially, the present invention could further reduce the time of the solar battery manufacturing process in forming the selenium layer and the sulfur in solid form. On the other hand, compared with the sulfidation method of supplying the sulfur steam to react with the CIGS layer, the present invention could solve the uneven sulfidation problem mentioned in the prior art since the sulfur steam generated by the sulfur 30 in solid form in a high temperature could contact with the selenium layer 28 uniformly, so as to improve the forming quality of the photoelectric transducing layer.

Figure 4:
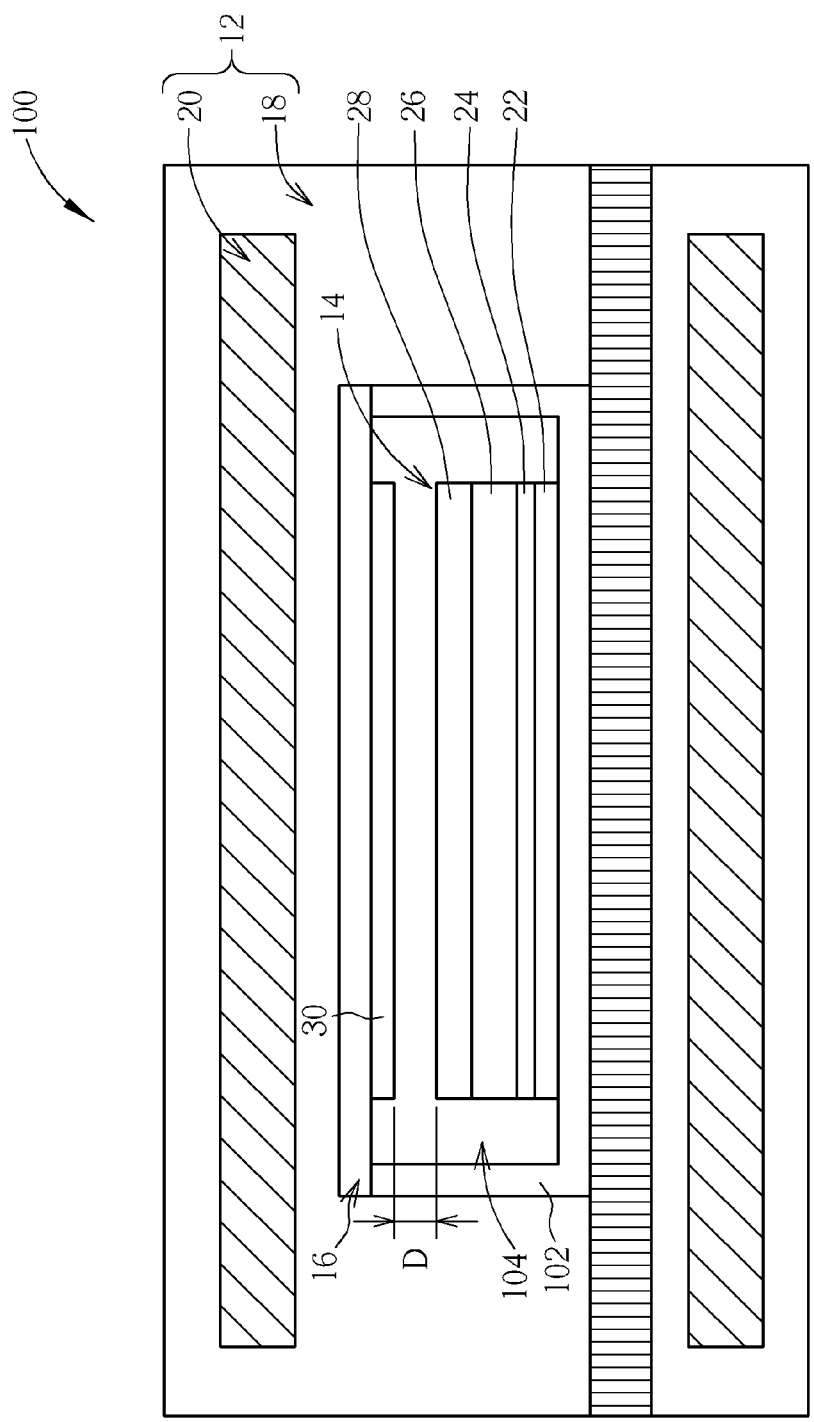
FIG. 4 is an inner diagram of a rapid thermal processing system according to another embodiment of the present invention.

It should be mentioned that the design in which the selenium layer 28 is opposite to the sulfur 30 in solid form is not limited to the aforesaid embodiment. For example, please refer to FIG. 4, which is an inner diagram of a rapid thermal processing system 100 according to another embodiment of the present invention. Components both mentioned in this embodiment and the aforesaid embodiment represent components with similar structures or functions, and the related description is omitted herein. As shown in FIG. 4, the rapid thermal processing system 100 includes the rapid thermal processing furnace 12, the back electrode substrate 14, the cover 16, and a containing casing 102. The containing casing 102 is connected to the cover 16 for forming a hermetic space cooperatively with the cover 16 to contain the back electrode substrate 14, so that the process of forming the photoelectric transducing layer on the back electrode substrate 14 could be performed in a hermetic environment. As for the related description of the sulfidation method in this embodiment, it can be reasoned according to the aforesaid embodiment.

Figure 5:
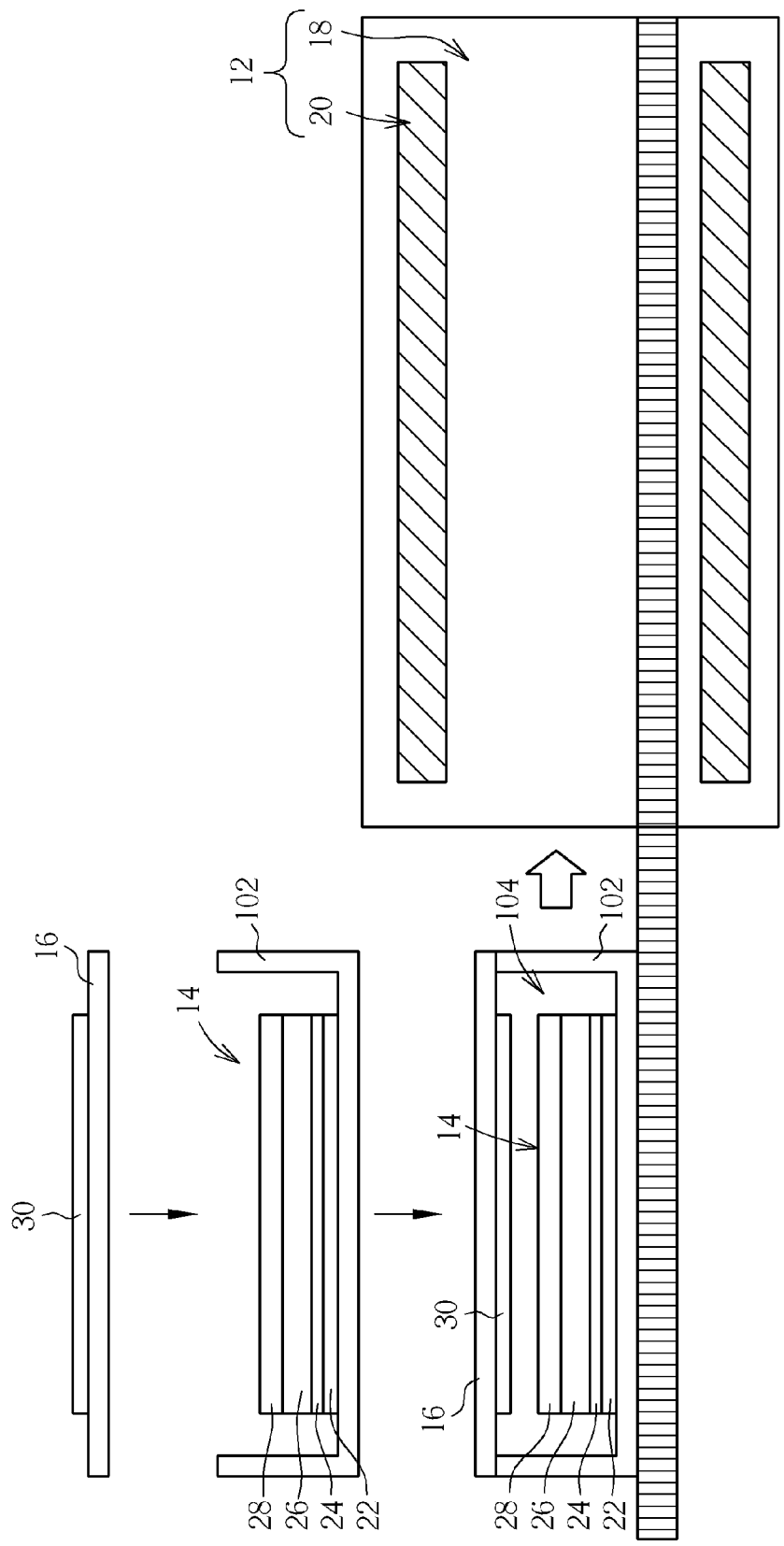
FIG. 5 is a diagram of a cover and a containing casing in FIG. 4 being transported into a reaction chamber of a rapid thermal processing furnace after cooperatively containing the back electrode substrate.

For example, please refer to FIG. 4 and FIG. 5. FIG. 5 is a diagram of the cover 16 and the containing casing 102 in FIG. 4 being transported into the reaction chamber 18 of the rapid thermal processing furnace 12 after cooperatively containing the back electrode substrate 14. In brief, after the selenium layer 28 and the sulfur 30 in solid form are formed on the precursor layer 26 and the cover 16 respectively, the back electrode substrate 14 could be disposed in the containing casing 102, and then the cover 16 could be disposed above the back electrode substrate 14 and connected to the containing casing 102 for forming the hermetic space 104 to contain the back electrode substrate 14. Subsequently, the cover 16 and the containing casing 102 with the back electrode substrate 14 could be transported (e.g. utilizing a conveyor belt) into the reaction chamber 18 of the rapid thermal processing furnace 12. Finally, the heating device 20 could be activated to generate heat energy so as to make the sulfur 30 in solid form react with the selenium layer 28 and the precursor layer 26 to form the photoelectric transducing layer. In such a manner, as mentioned in the aforesaid embodiment, not only could the sulfidation method according to this embodiment efficiently reduce the reaction time of the sulfur 30 in solid form, the selenium layer 28 and the precursor layer 26 to solve the prior art problem that the substitution reaction occurring between the sulfur steam and the CIGS layer is too long, but also decrease the temperature needed for forming the photoelectric transducing layer. In addition, the sulfidation method according to this embodiment could also be performed without utilizing harmful gas (e.g. $H_2S$). Moreover, via the design in which the containing casing 102 in FIG. 5 and the cover are transported into the reaction chamber 18 together, an automation design could be further applied to the sulfidation method according to this embodiment for increasing the productive capacity of the rapid thermal processing system.

Similarly, the sequence mentioned in the step of disposing the back electrode substrate 14 and the cover 16 in the reaction chamber 18 of the rapid thermal processing furnace 12 is not limited to the sequence as shown in FIG. 5. That is, in another embodiment, before the cover 16 is disposed above the back electrode substrate 14 and connected to the containing casing 102 for forming the hermetic space 102 to contain the back electrode substrate 14, the containing casing 102 with the back electrode substrate 14 could be transported into the reaction chamber 18 in advance.

Compared with the prior art, the present invention utilizes the design in which the cover with the sulfur in solid form deposited thereon is disposed at a position corresponding to the back electrode substrate with the selenium layer and the precursor layer deposited thereon and the rapid thermal processing furnace is utilized to heat the cover and the back electrode substrate, to reduce the process temperature and time of the sulfidation process. In such a manner, the sulfidation method provided by the present invention could prevent a significant decrease of current caused by excessive diffusion of the sulfur in solid form and solve the problem that the sulfidation reaction is hard to control because the reaction rate of the sulfur in solid form and the CIG stacked layer is too fast. Furthermore, the present invention could further solve the prior art problem that the substitution reaction occurring between the sulfur steam and the CIGS layer is too long and the uneven sulfidation problem. In addition, the sulfidation method provided by the present invention could also be performed without utilizing harmful gas (e.g. $H_2S$).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rapid thermal processing system comprising:
   a rapid thermal processing furnace comprising:
      a reaction chamber; and
      a heating device for generating heat energy;
   a back electrode substrate adapted to dispose in the reaction chamber and having a precursor layer and a selenium layer formed on the precursor layer; and
   a cover disposed at a position corresponding to the selenium layer on the back electrode substrate and having a sulfur in solid form formed thereon, so as to make the sulfur in solid form opposite to the selenium layer;
   wherein after the sulfur in solid form absorbs the heat energy generated by the heating device, the sulfur in solid form reacts with the selenium layer and the precursor layer to form a photoelectric transducing layer.

2. The rapid thermal processing system of claim 1, wherein the cover is disposed above the back electrode substrate so as to make the sulfur in solid form opposite to the selenium layer up-and-down.

3. The rapid thermal processing system of claim 1, wherein the sulfur in solid form is opposite to the selenium layer in a face-to-face manner.

4. The rapid thermal processing system of claim 1 further comprising:
   a containing casing connected to the cover for forming a hermetic space cooperatively with the cover to contain the back electrode substrate.

5. The rapid thermal processing system of claim 1, wherein the cover is made of heat absorbing material.

6. The rapid thermal processing system of claim 5, wherein the cover is made of carbon material.

7. The rapid thermal processing system of claim 5, wherein the precursor layer is made of copper (Cu) material, indium (In) material, and gallium (Ga) material.

8. The rapid thermal processing system of claim 1, wherein the photoelectric transducing layer is a CIGS (copper indium gallium selenide) structure, and a CIGSS (copper indium gallium selenide sulfide) thin film is formed on a surface of the CIGS structure.

9. A sulfidation method for forming a photoelectric transducing layer on a back electrode substrate, a precursor layer being formed on the back electrode substrate, the sulfidation method comprising:
- forming a selenium layer and a sulfur in solid form on the precursor layer and a cover respectively;
- disposing the back electrode substrate and the cover in a rapid thermal processing furnace in a manner of the selenium layer being opposite to the sulfur in solid form; and
- heating the sulfur in solid form to react with the selenium layer and the precursor layer for forming the photoelectric transducing layer.

10. The sulfidation method of claim 9, wherein disposing the back electrode substrate and the cover in the rapid thermal processing furnace in a manner of the selenium layer being opposite to the sulfur in solid form comprises:
- disposing the back electrode substrate in the rapid thermal processing furnace; and
- disposing the cover at a position corresponding to the selenium layer of the back electrode substrate so as to make the selenium layer opposite to the sulfur in solid form.

11. The sulfidation method of claim 9, wherein disposing the back electrode substrate and the cover in the rapid thermal processing furnace in a manner of the selenium layer being opposite to the sulfur in solid form comprises:
- disposing the cover at a position corresponding to the selenium layer of the back electrode substrate so as to make the selenium layer opposite to the sulfur in solid form; and
- disposing the back electrode substrate with the cover in the rapid thermal processing furnace.

12. The sulfidation method of claim 9, wherein disposing the back electrode substrate and the cover in the rapid thermal processing furnace in a manner of the selenium layer being opposite to the sulfur in solid form comprises:
- providing a containing casing;
- disposing the back electrode substrate in the containing casing;
- disposing the cover at a position corresponding to the selenium layer of the back electrode substrate so as to make the selenium layer opposite to the sulfur in solid form;
- connecting the containing casing to the cover for forming a hermetic space to contain the back electrode substrate; and
- transporting the cover and the containing casing with the back electrode substrate into the rapid thermal processing furnace.

13. The sulfidation method of claim 9, wherein disposing the back electrode substrate and the cover in the rapid thermal processing furnace in a manner of the selenium layer being opposite to the sulfur in solid form comprises:
- providing a containing casing;
- disposing the back electrode substrate in the containing casing;
- transporting the containing casing with the back electrode substrate into the rapid thermal processing furnace;
- disposing the cover at a position corresponding to the selenium layer of the back electrode substrate so as to make the selenium layer opposite to the sulfur in solid form; and
- connecting the containing casing to the cover for forming a hermetic space to contain the back electrode substrate.

14. The sulfidation method of claim 9, wherein disposing the back electrode substrate and the cover in the rapid thermal processing furnace in a manner of the selenium layer being opposite to the sulfur in solid form comprises:
- disposing the cover above the back electrode substrate to make the selenium layer opposite to the sulfur in solid form up-and-down.

15. The sulfidation method of claim 9, wherein disposing the back electrode substrate and the cover in the rapid thermal processing furnace in a manner of the selenium layer being opposite to the sulfur in solid form comprises:
- disposing the back electrode substrate and the cover in the rapid thermal processing furnace in a manner of the sulfur in solid form facing the selenium layer.

* * * * *